US00RE40684E

(19) United States
(12) Reissued Patent
Keller

(10) Patent Number: US RE40,684 E
(45) Date of Reissued Patent: Mar. 24, 2009

(54) FAST CYCLIC REDUNDANCY CHECK (CRC) GENERATION

(76) Inventor: Richard B. Keller, 2112 NE. 154th Ave., Vancouver, WA (US) 98684

(21) Appl. No.: 11/598,156

(22) Filed: Nov. 9, 2006

Related U.S. Patent Documents

Reissue of:
(64) Patent No.: 6,820,228
Issued: Nov. 16, 2004
Appl. No.: 09/884,312
Filed: Jun. 18, 2001

(51) Int. Cl.
*H03M 13/00* (2006.01)

(52) U.S. Cl. ..... 714/757; 714/800; 714/801; 714/807; 714/808; 714/758

(58) Field of Classification Search ..... None
See application file for complete search history.

(56) References Cited

U.S. PATENT DOCUMENTS

| | | | | |
|---|---|---|---|---|
| 4,937,828 | A | 6/1990 | Shih et al. | |
| 5,103,451 | A | 4/1992 | Fossey | |
| 5,859,859 | A | 1/1999 | Kim | |
| 5,878,057 | A | 3/1999 | Maa | |
| 6,530,057 | B1 * | 3/2003 | Kimmitt | 714/758 |
| 6,701,478 | B1 * | 3/2004 | Yang et al. | 714/757 |
| 6,732,318 | B2 * | 5/2004 | Collier et al. | 714/758 |

OTHER PUBLICATIONS

Guido Albertengo & Richardo Sisto, "Parallel CRC Generation", IEEE Micro, 0272–1732/90/1000–0063501.00, Oct. 1990.

"High–Speed Parallel Cyclic Redundancy Check Generator", IBM Technical Disclosure Bulletin NN901051, vol. 33, Issue 5, pp. 51–56, Oct. 1, 1990.

* cited by examiner

*Primary Examiner*—John P Trimmings
(74) *Attorney, Agent, or Firm*—Schwabe, Williamson & Wyatt P.C.

(57) ABSTRACT

A CRC generation unit includes a number of CRC calculation assemblies to be selectively employed to incrementally calculate a CRC value for a first sequence of N data bytes. The calculation is iteratively performed, one iteration at a time. Further, the selection of the CRC calculation assemblies is made in accordance with the group size of each of a number of data word groups of the N data bytes. In one embodiment, the CRC calculation assemblies include a first assembly for incrementally calculate the CRC value for an iteration, whenever the group size is n/2 bytes or less for the iteration, and a second assembly for incrementally calculate the CRC value for an iteration, whenever the group size is more than n/2 bytes for the iteration. In one embodiment, the CRC generation unit is a shared resource to multiple network traffic flow processing units of a network traffic routing IC.

46 Claims, 7 Drawing Sheets

FAST CYCLIC REDUNDANCY CHECK (CRC) GENERATION

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to the field of data processing. More specifically, the present invention relates to high speed cyclic redundancy check (CRC) generation, having special application to high speed network traffic routing, such as Gigabit Ethernet packet switching.

2. Background Information

Cyclic Redundancy Check (CRC) has long been employed as a metric to detect transmission errors. The technique is employed in a wide variety of data processing related disciplines, including in particular, networking. The underlying mathematics including the polynomial divisions involved in the generation of a CRC value for a data block is well understood among those ordinarily skilled in the art. Various hardware as well as software implementations are known. Examples of known hardware implementations include but are not limited to the implementations available from e.g. Actel of Sunnyvale, CA.

With advances in integrated circuit, microprocessor, networking and communication technologies, increasing number of devices, in particular, digital computing devices, are being networked together. Devices are often first coupled to a local area network, such as an Ethernet based office/home network. In turn, the local area networks are interconnected together through wide area networks, such as SONET, ATM, or Frame Relay networks, and the like. Of particular notoriety is the TCP/IP based global inter-networks, Internet.

As a result of this trend of increased connectivity, increasing number of applications that are network dependent are being deployed. Examples of these network dependent applications include but are not limited to, email, net based telephony, world wide web and various types of e-commerce. Successes of many of these content/service providers as well as commerce sites depend on high speed delivery of a large volume of data. As a result, high speed networking, which in turn translates into high speed CRC generation is needed.

Unfortunately, the current generation of CRC generators known in the art are generally unable to meet the speed requirement of the next generation IC based high speed network traffic routing devices. For these IC based devices, it is not only necessary for the CRC generation resource to be sufficiently fast to keep pace with the processing of a single network traffic flow, it is further desirable that the CRC generation resource to be sufficiently efficient and fast, such that it can be shared among the various flow processing units, thereby eliminating the need to have dedicated CRC generation resource for-each of the flow processing units.

Thus, a highly efficient approach to CRC generation is needed.

SUMMARY OF THE INVENTION

A CRC generation unit includes a number of CRC calculation assemblies to be selectively employed to incrementally calculate a CRC value for a sequence of N data bytes. The calculation is iteratively performed, one iteration at a time. Further, the selection of the CRC calculation assemblies is made in accordance with the group size of each of a number of data word groups of the N data bytes.

In one embodiment, the CRC calculation assemblies include a first assembly to incrementally calculate the CRC value for an iteration, whenever the group size for the iteration is n/2 bytes or less, and a second assembly to incrementally calculate the CRC value for an iteration, whenever the group size for the iteration is more than n/2 bytes.

In one embodiment, the CRC generation unit is a shared resource to multiple network traffic flow processing units of a network traffic routing IC.

In one embodiment, the network traffic routing device is disposed on a single integrated circuit.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention. Further, the description repeatedly uses the phrase "in one embodiment", which ordinarily does not refer to the same embodiment, although it may.

Overview

Figure 1:
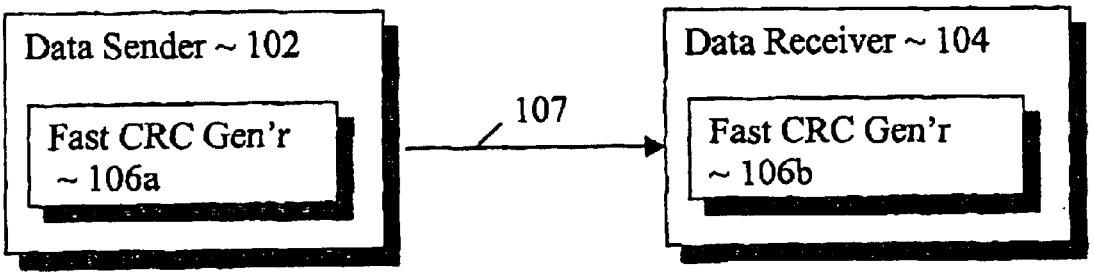
FIG. 1 illustrates an overview of the present invention.

Referring now to FIG. 1, wherein an overview of the present invention is illustrated. As shown, data sender 102 and data receiver 104 are coupled to each other via communication link 107, over which data sender 102 may send data, including associated CRC values, to data receiver 104. Both data sender 102 and data receiver 104 are equipped with fast CRC generator 106a/106b of the present invention for generating CRC values for the data blocks being sent from data sender 102 to data receiver 104. As will be described in more detail below, fast CRC generator 106a/106b includes redundant circuit elements organized in accordance with a parallel architecture to allow various calculations to be performed in an overlapped and parallel manner. As a result, fast CRC generator 106a/106b may generate CRC values of variable length data blocks, such as variable length packet data, efficiently. In fact, experience has shown that fast CRC generator 106a/106b is sufficiently efficient to allow fast CRC generator 106a/106b to be shared by as many as 64 collections of network traffic flow processing resources of an IC based gigabit Ethernet routing device, resulting in a substantial net reduction in real estate requirement (notwithstanding the duplication of certain elements to enable the overlapped and parallel computations).

Except for fast CRC generator 106a/106b, data sender 102, data receiver 104 and communication link 107 are all intended to represent a broad range of data sending, data receiving and communication systems and/or components known in the art. Accordingly, except for fast CRC generator 106a/106b, data sender 102, data receiver 104 and communication link 107 will not be otherwise further described.

Fast CRC Generator

Figure 3:
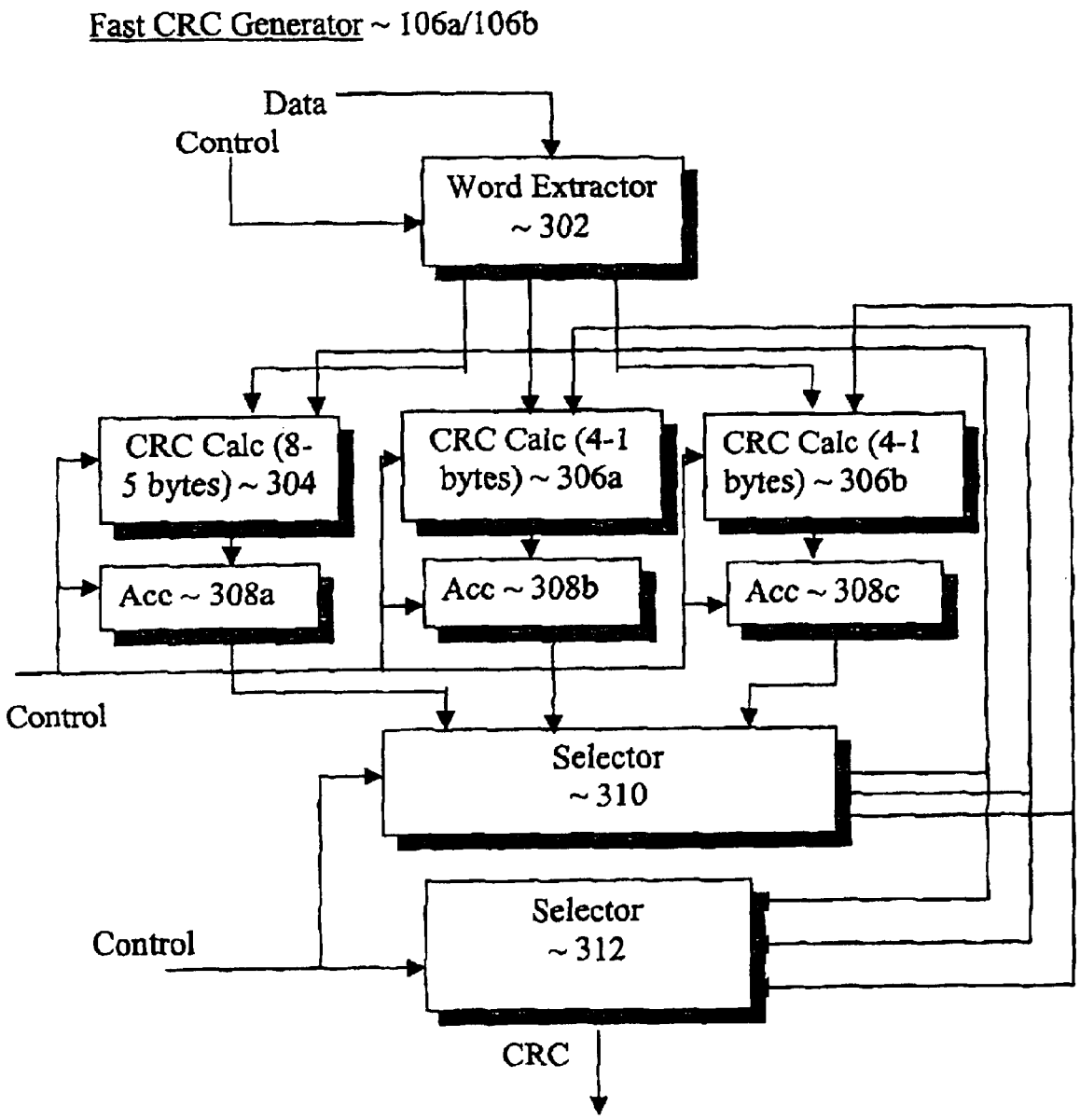
FIG. 3 illustrates one of the fast CRC generators of FIG. 1 in further detail, in accordance with one embodiment.

FIG. 3 illustrates one of fast CRC generators 106a/106b of FIG. 1 in further details, in accordance with one embodiment. As illustrated, each fast CRC generator 106a/106b includes three CRC calculation assembly and accumulator pairs 304 and 308a, 306a and 308b, and 306b and 308c to facilitate overlapped CRC generation for two successive variable length series of data block groups. The CRC calculations are iteratively performed. Each fast CRC generator 106a/106b further includes word extractor 302, and selectors 310 and 312, complementing the three CRC calculation assembly and accumulator pairs, 304 and 308a, 306a and 308b, and 306b and 308c. The elements are coupled to each other as shown.

Word extractor 302 is employed to extract data word groups from an input data stream. CRC calculation assembly and accumulator pair 304 and 308a is employed to incrementally calculate the CRC value for a series of data word groups, for an iteration, whenever the group size of the extracted data word group for the iteration is more than n/2 data bytes, where n is an integer. Each of CRC calculation assembly and accumulator pairs 306a and 306b, and 306b and 308c is employed to incrementally calculate the CRC value for a series of data word groups, for an iteration, whenever the group size of the extracted data word group for the iteration is n/2 data bytes or less.

Selector 310 is employed to re-circulate an appropriate one of the accumulated calculation results stored in accumulator 308a–308c to an appropriate one of calculation assemblies 304 and 306a–306b for the next iteration. At the end of the calculation, selector 312, in conjunction with selector 310, facilitates selection 14 of one of the accumulated calculation results stored in accumulator 308a–308c to output or generate as the calculated CRC value.

The duplication of the CRC calculation resources for handling extract data word group with group sizes n/2 data bytes or less, advantageously enable the overlapping calculation of two CRC values for two successive series of data word groups. More specifically, it enables the current handling of the last data word group of a series of data words (e.g. a packet), and the first data word group of the next series of data words (e.g. the immediately following packet). [Note that it is impossible for both data word groups to have a group size of greater than n/2, and of course if one of the data word group has a group size greater than n/2, the group size of the other data word group necessarily is less than n/2. For the latter situation, no duplication of resources is necessary.]

Figure 2:
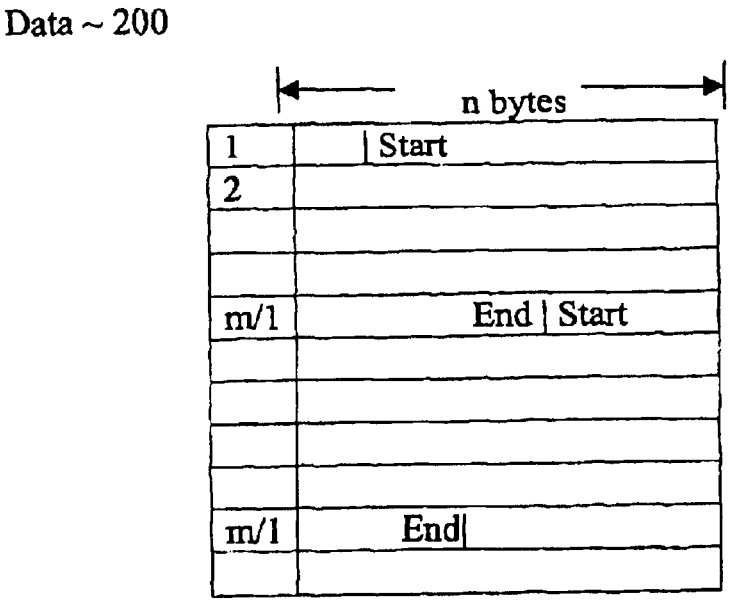
FIG. 2 illustrates an example of packet data alignment or the lack thereof.

Before describing the particular embodiment of CRC generator 106a/106b, we refer first to FIG. 2, illustrating input data 200, wherein the alignment or the lack thereof, for successive variable length series of data block groups, such as variable length series of data packets, is illustrated. As shown, each variable length series of data block groups may be received through m groups of data word groups, where m is an integer equal to or greater than 1. The group size of each data word group may be 1, 2, 3 . . . or n bytes, where n is also an integer. In various embodiments, n equals 8. For these embodiments, n/2 equals 4.

Referring back to FIG. 3, accordingly for the embodiments where n equals 8, CRC calculation assembly and accumulator pair 304 and 308a is employed to incrementally calculate the CRC value for a series of data word groups, for an iteration, whenever the group size of the extracted data word group for the iteration is more than 4 data bytes (i.e. between 8 to 5 data bytes). Each of CRC calculation assembly and accumulator pairs 306a and 306b, and 306b and 308c is employed to incrementally calculate the CRC value for a series of data word groups, for an iteration, whenever the group size of the extracted data word group for the iteration is 4 data bytes or less (i.e. between 4 to 1 data bytes).

CRC Calculation Assembly (8 to 5 bytes)

Figure 4A:
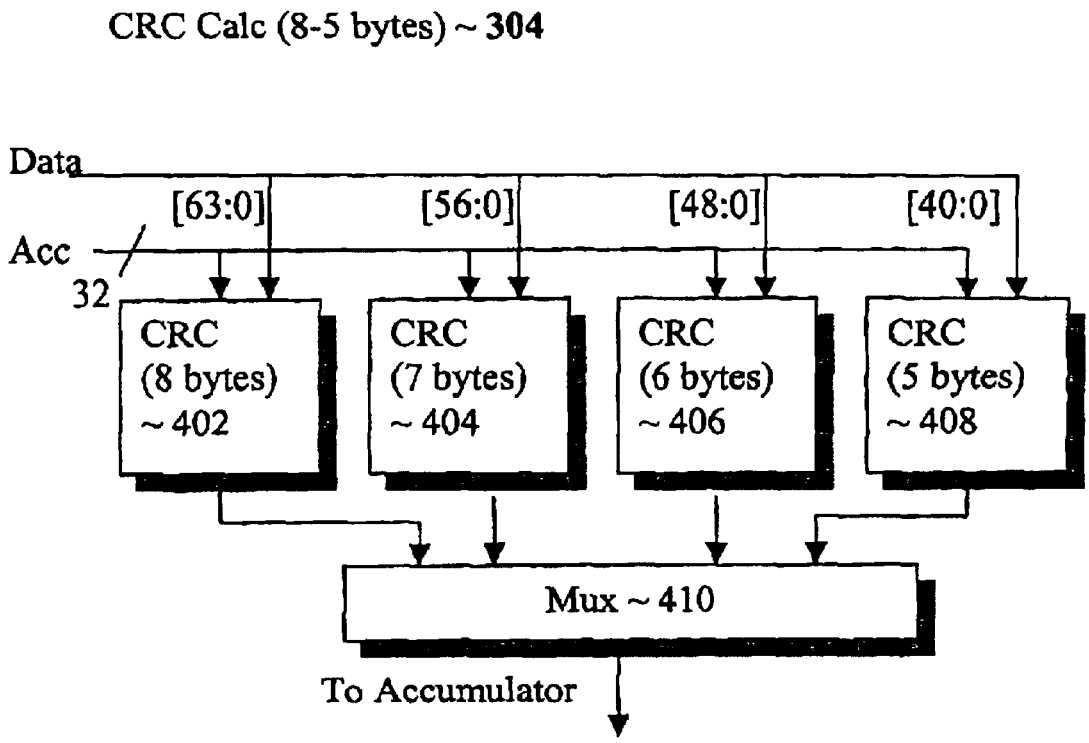
FIGS. 4a–4b illustrate the 8-5 bytes CRC Calculator of FIG. 3 in further detail, in accordance with two embodiments.

FIG. 4a illustrates CRC calculation assembly 304 of FIG. 3 in further details, in accordance with one embodiment. As illustrated, CRC calculation assembly 304 includes four CRC calculators 402, 404, 406, and 408, and a multiplexor 410, coupled to each other as shown. Each of CRC calculators 402, 404, 406, and 408 is employed to handle the incremental calculation for an iteration for one of the group sizes. The bit distribution for an embodiment using a 64-bit data line is labelled above each CRC calculator ([63:0], [56:0], [48:0], [40:0]). More specifically, CRC calculator 402 is employed to handle the incremental calculation for an iteration for a data word group with a group size of 8 bytes, CRC calculator 404 is employed to handle the incremental calculation for an iteration for a data word group with a group size of 7 bytes, and so forth.

In other words, CRC calculation assembly 304 (for handling more than n/2 bytes calculation) has exactly n/2 CRC calculators. In each iteration, one of CRC calculators 402, 404, 406, and 408 is selected for use tin accordance with the group size of the extracted data word group for the iteration).

Each CRC calculator 402, 404, 406 or 408 may be constituted with any one of a number of known CRC calculation circuitry, e.g. polynomial division circuitry.

Figure 4B:
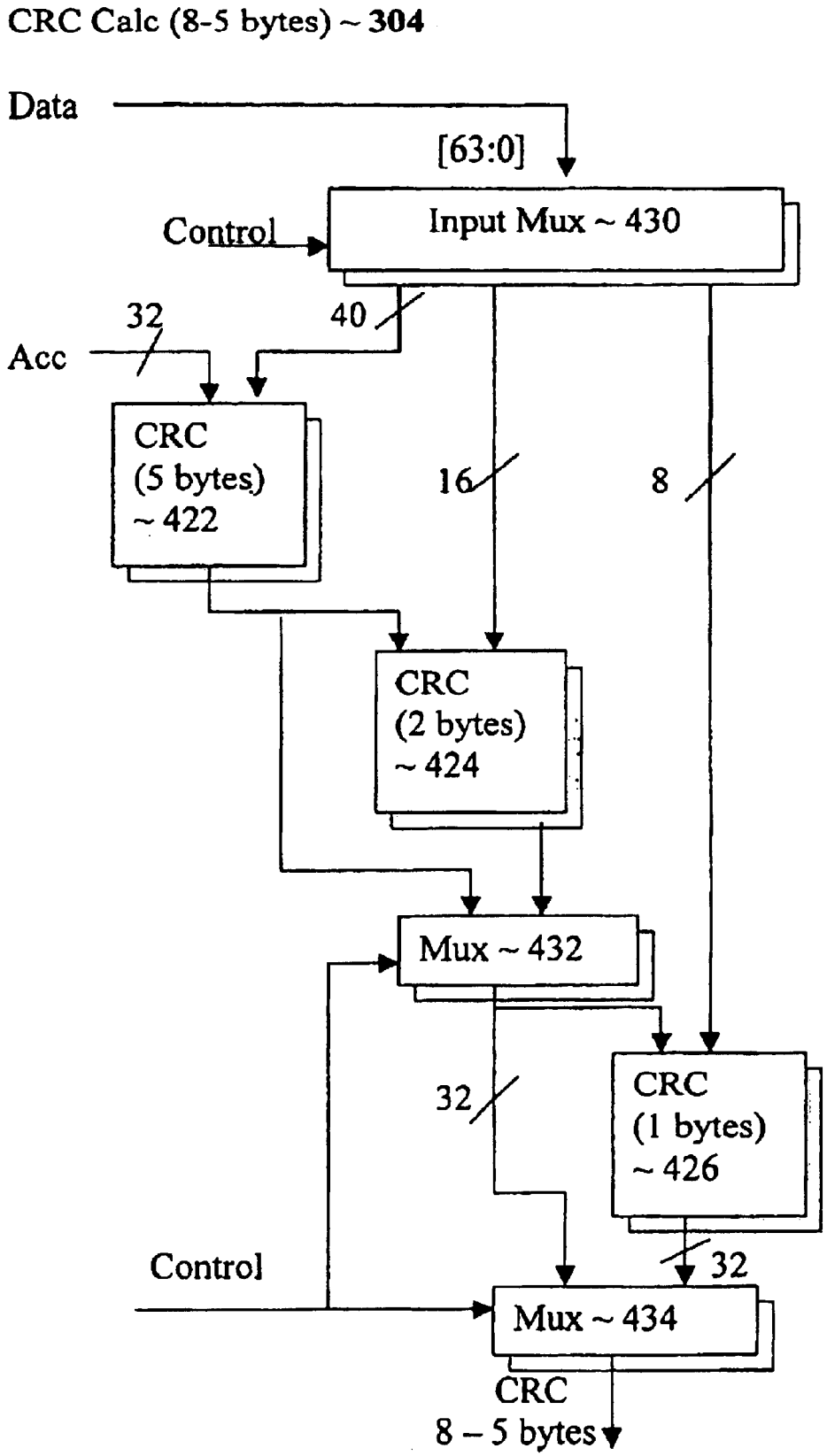

FIG. 4b illustrates CRC calculation assembly 304 of FIG. 3 in further details, in accordance with another embodiment. As illustrated, CRC calculation assembly 304 includes input multiplexor 430, three CRC calculators 422, 424, and 426, and multiplexors 432 and 434, coupled to each other as shown. The bit distribution for an embodiment using a 64-bit data line is labelled above the input multiplexor 430 ([64:0]). CRC calculators 422, 424, and 426 are employed in combination at least some of the time to handle the incremental calculation for an iteration for one of the group sizes. More specifically, CRC calculator 422 is employed to handle the incremental calculation for an iteration for a data word group with a group size of 5 bytes, and CRC calculators 422 and 426 are employed in combination to handle the incremental calculation for an iteration for a data word group with a group size of 6 bytes. Similarly, CRC calculators 422 and 424 are employed to handle the incremental calculation for an iteration for a data word group with a group size of 7 bytes, and CRC calculators 422, 424, and 426 are employed in combination to handle the incremental calculation for an iteration for a data word group with a group size of 8 bytes.

In other words, CRC calculation assembly 304 (for handing more than n/2 bytes calculation) has less than n/2 CRC calculators. In each of the iterations for some data group sizes, CRC calculators 422, 424, and 426 are employed in combination.

Similarly, each CRC calculator 422, 424, 426 or 428 may be constituted with any one of a number of known CRC calculation circuitry, e.g. polynomial division circuitry.

CRC Calculation Assembly (4 to 1 byte)

Figure 5A:
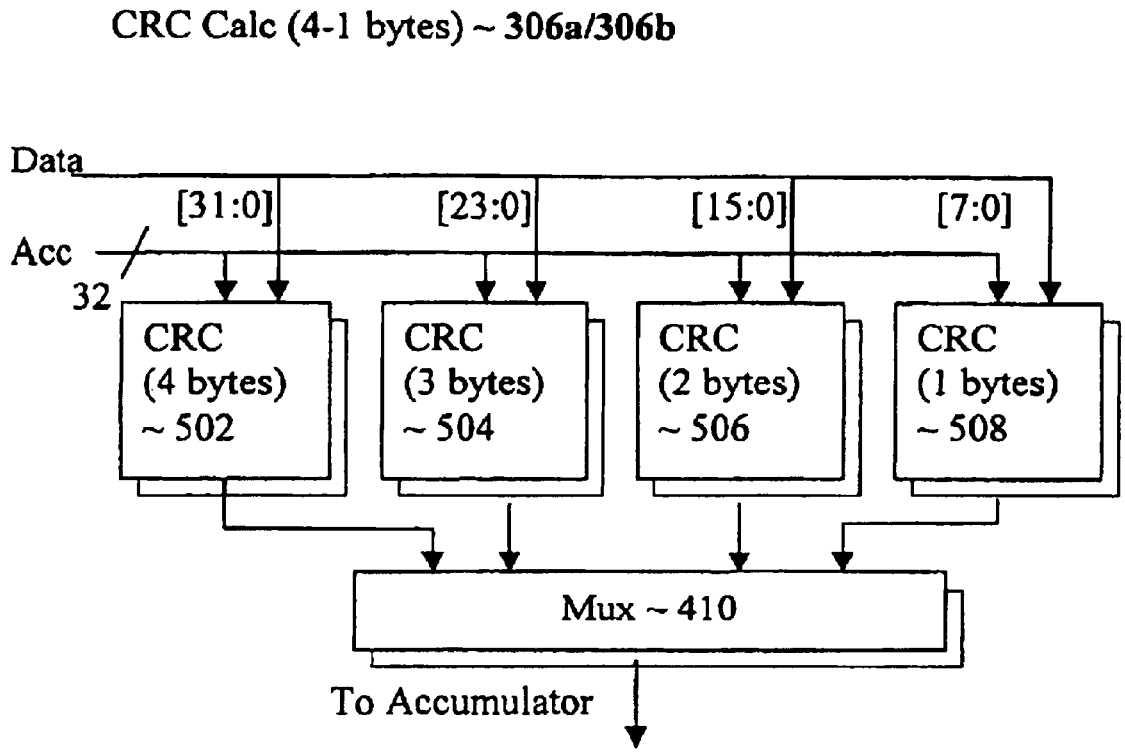
FIGS. 5a–5b illustrate the 4-1 bytes CRC Calculator of FIG. 3 in further detail, in accordance with two embodiments.
Figure 5B:
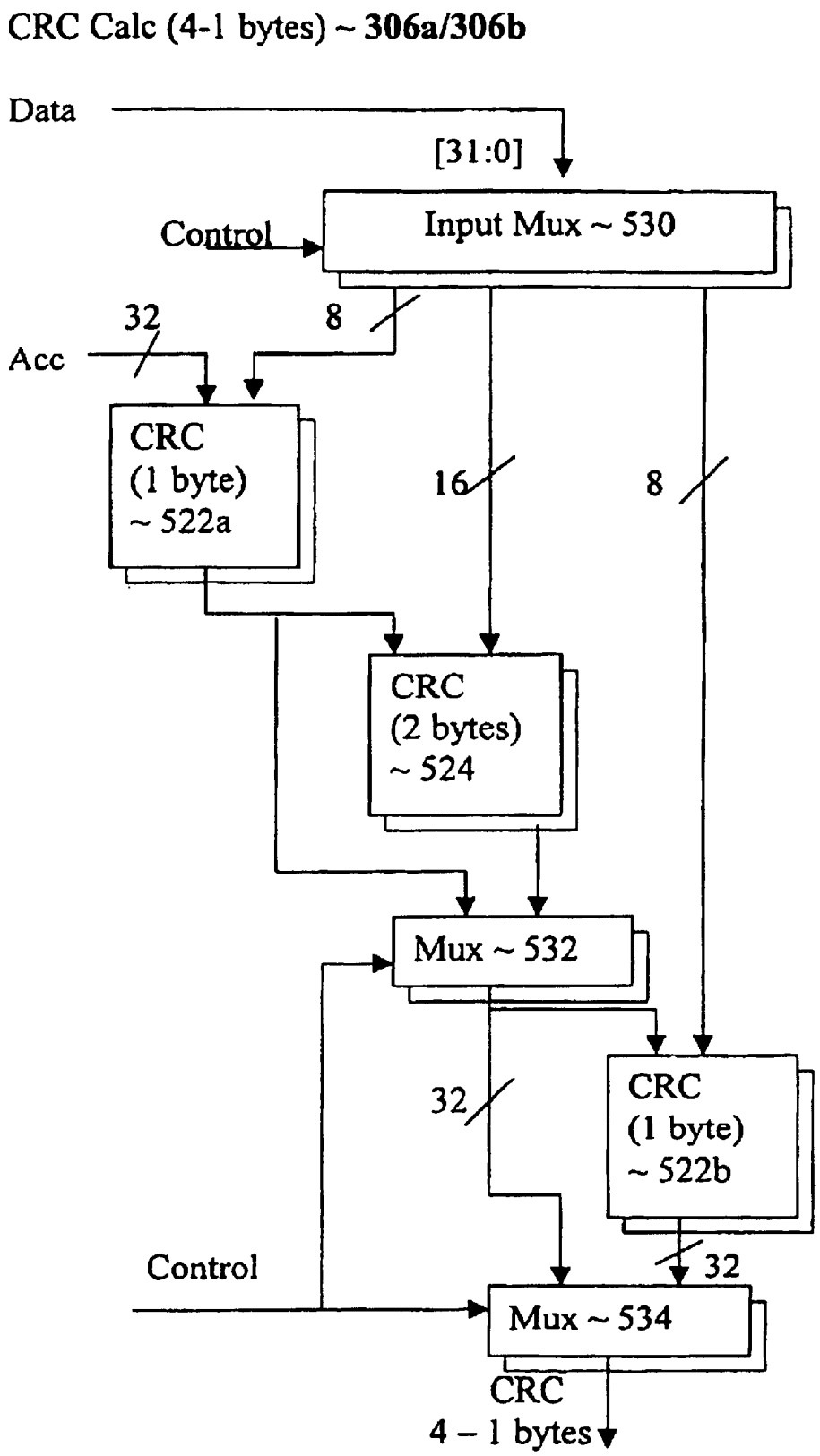

FIGS. 5a–5b illustrate CRC calculation assembly 306a/306b of FIG. 3 in further details, in accordance with one embodiment. As illustrated, in each embodiment, CRC calculation assembly 306a/306b is similarly constituted as the corresponding embodiment of CRC calculation assembly 304.

In other words, for the embodiment of FIG. 5a, CRC calculation assembly 306a/306b (for handling n/2 bytes or less calculation) has exactly n/2 CRC calculators, as the embodiment of FIG. 4a for CRC calculation assembly 304. In each iteration, one of CRC calculators 502, 504, 506, and 508 is selected for use (in accordance with the group size of the extracted data word group for the iteration). However, for the embodiment of FIG. 5b, CRC calculation assembly 306a/306b (for handling n/2 bytes or less calculation) has less than n/2 CRC calculators, as the embodiment of FIG. 4b for CRC calculation assembly 304. In each of the iteration, for some data group sizes, CRC calculators 522a, 524b, and 522b are employed in combination. Furthermore, the embodiment of FIG. 5b includes multiplexors 530, 532, and 534 coupled to the CRC calculators 522a, 524, and 522b and each other as shown.

Similar to FIGS. 4a and 4b, the bit distribution for an embodiment using a 64-bit data line is labelled above each CRC calculator ([63:0], [56:0], [48:0], [40:0]) in FIG. 5a, and above the input multiplexor 530 ([64:0]) in FIG. 5b. Likewise, each CRC calculator, 502, 504, 506, and 508 of FIG. 5a, and 522a, 522b, and 524 of FIG. 5b, may be constituted with any one of a number of known CRC calculation circuitry, e.g. polynomial division circuitry.

Example Application

Figure 6:
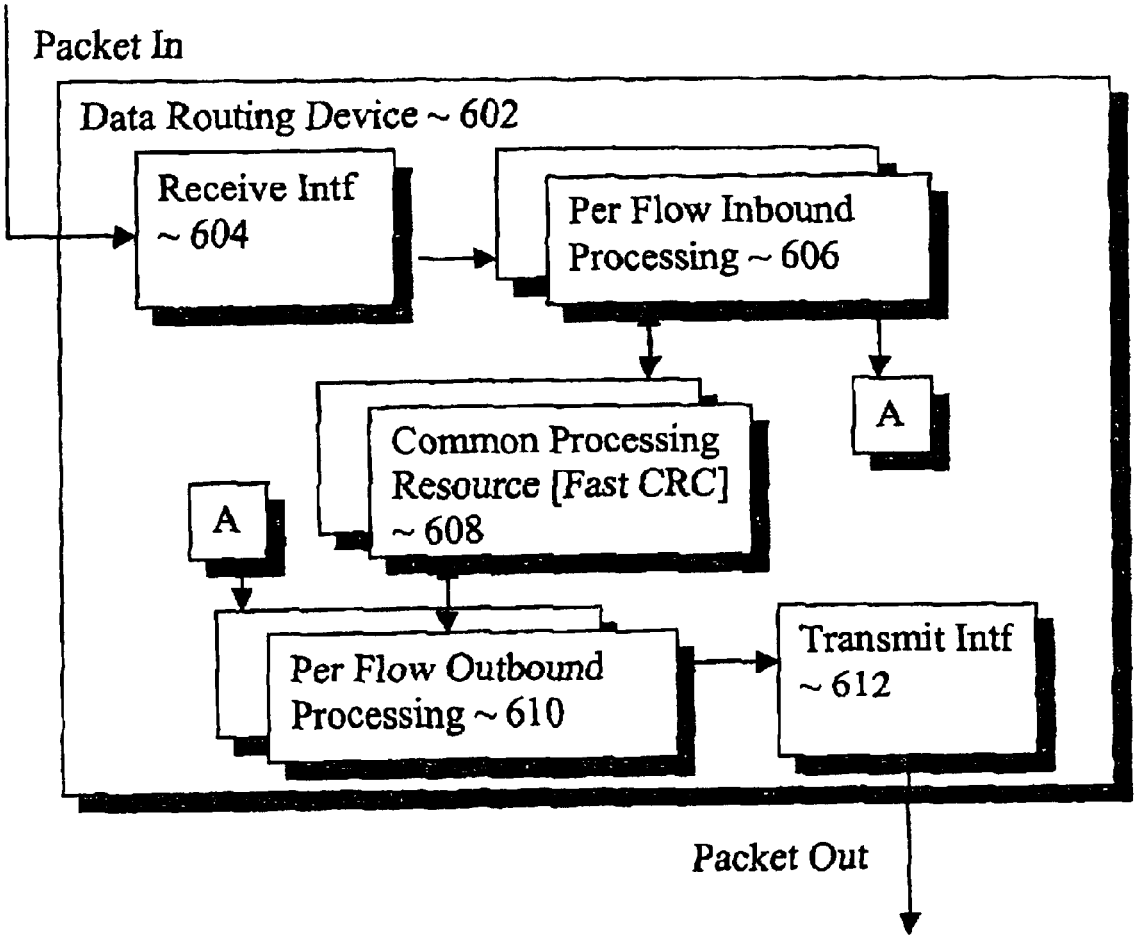
FIG. 6 illustrates an example routing device incorporated with the fast CRC generation teaching of the present invention.

FIG. 6 illustrates an example application of the fast CRC generator of the present invention. As illustrated, data routing device 602 comprising receive interface 604 and transmit interface 612 is advantageously provided with a number of per flow inbound processing units 606 and a number of per flow outbound processing units 610. Examples of these per flow inbound and outbound processing functions may include but are not limited to deciphering and ciphering functions. Additionally, data routing device 602 may also include a number of other common or shared function units 608.

For the illustrated embodiment, common/shared function units 608 include in particular a shared CRC generation function block, incorporated with the fast CRC generator of FIG. 3. Accordingly, the common/shared CRC generator may alternate between generating CRC values for different data packets of the different flows being processed by per flow inbound/outbound processing units 606/610.

As a result, the amount of storage required for provisioning the CRC function for the various flows being processed in parallel is substantially reduced under the present invention. In turn, data routing device 602 may be advantageously disposed on a single integrated circuit. Thus, data routing device 602 is able to handle high speed line rate data packet switching for multiple data flows at the same time. In one embodiment, data routing device 602 is an IC component for routing packets transmitted over an optical medium onto an electrical medium at very high speed.

Conclusion and Epilogue

Thus, it can be seen from the above descriptions, a novel highly efficient method and apparatus for generating CRC for data blocks or data packets has been described. While the present invention has been described in terms of the above described embodiments, those skilled in the art will recognize that the invention is not limited to the embodiments described. The present invention can be practiced with modification and alteration within the spirit and scope of the appended claims. Thus, the description is to be regarded as illustrative instead of restrictive on the present invention.

What is claimed is:

1. An apparatus comprising:

a data word extractor to successively extract a first plurality of data word groups from a stream of input data, one data word group at a time, with each extracted data word group having a group size of at most n bytes, where n is an integer;

a plurality of CRC calculation assemblies coupled to the data word extractor to be selectively employed to incrementally calculate a CRC value for the first plurality of data word groups, the calculation being iteratively performed, one iteration at a time, and for each iteration, the selection of the CRC calculation assemblies being made in accordance with the group size of the data word group extracted for the iteration;

a plurality of storage elements correspondingly coupled to the plurality of CRC calculation assemblies to correspondingly store the results generated by the corresponding ones of the CRC calculation assemblies for one iteration of the calculation; and a plurality of selectors coupled to the storage elements and the plurality of CRC calculation assemblies to selectively re-circulate one of the stored results back to the selected one of the CRC calculation assemblies for the next iteration of calculation, and to selectively output one of the stored results as the calculated CRC value at the end of the iterative calculation.

2. The apparatus of claim 1, wherein the plurality of CRC calculation assemblies comprise a first CRC calculation assembly coupled to the data word extractor to incrementally calculate the CRC value for said first plurality of data word groups for an iteration, whenever the data word extractor extracts a data word group of n/2 or less bytes for the iteration, where n is an even integer.

3. The apparatus of claim 2, wherein the first CRC calculation assembly comprises less than n/2 CRC calculators coupled to each other in a cascaded manner to be selectively employed in combination in at least some of the time to incrementally calculate the CRC value for said first plurality of data word groups for an iteration, whenever the data word extractor extracts a data word group of n/2 or less bytes for the iteration.

4. The apparatus of claim 2, wherein the first CRC calculation assembly comprises n/2 CRC calculators to be selectively employed exclusively to incrementally calculate the CRC value for said first plurality of data word groups for an iteration, whenever the data word extractor extracts a data word group of n/2 or less data bytes for the iteration.

5. The apparatus of claim 2, wherein the plurality of CRC calculation assemblies further comprise a second CRC calculation assembly coupled to the data word extractor to incrementally calculate the CRC value for said first plurality of data word groups for an iteration, whenever the data word extractor extracts a data word group of more than n/2 bytes for the iteration.

6. The apparatus of claim 5, wherein the second CRC calculation assembly comprises less than n/2 CRC calculators to be selectively employed in combination at least some of the times to incrementally calculate the CRC value for said first plurality of data word groups for an iteration, whenever the data word extractor extracts a data word group of more than n/2 bytes for the iteration.

7. The apparatus of claim 5, wherein the second CRC calculation assembly comprises n/2 CRC calculators to be selectively employed exclusively to incrementally calculate the CRC value for said first plurality of data word groups for an iteration, whenever the data word extractor extracts a data word group of more than n/2 bytes for the iteration.

8. The apparatus of claim 2, wherein the data word extractor also extracts a second plurality of word groups, and the plurality of CRC calculation assemblies further comprise a second CRC calculation assembly coupled to the data word extractor to incrementally calculate a CRC value for the second plurality of data word groups, for an iteration, whenever the data word extractor extracts for the second plurality of data word groups, a data word group of n/2 or less bytes, where n is an even integer.

9. The apparatus of claim 1, wherein the plurality of selectors comprise a first selector coupled to the storage elements and the plurality of CRC calculation assemblies to selectively re-circulate one of the stored results back to the selected one of the CRC calculation assemblies for the next iteration of calculation, and a second selector coupled to the first selector to cooperate with the first selector to selectively output one of the stored results as the calculated CRC value at the end of the iterative calculation.

10. The apparatus of claim 1, wherein n equals 8.

11. The apparatus of claim 1, wherein the apparatus is disposed on an integrated circuit.

12. A method comprising:

successively extracting by a data word extractor a first plurality of data word groups from a stream of input data, one data word group at a time, with each extracted data word group having a group size of at most n bytes, where n is an integer;

selectively employing a plurality of CRC calculation assemblies coupled to the data word extractor to incrementally calculate a CRC value for the first plurality of data word groups, with the calculation being iteratively performed, one iteration at a time, and for each iteration, selecting the CRC calculation assemblies in accordance with the group size of the data word group extracted for the iteration;

correspondingly storing the results generated by the plurality of CRC calculation assemblies for one iteration of the iterative calculation into a plurality of storage elements; and selectively re-circulating one of the stored results back to the selected one of the CRC calculation assemblies for the next iteration of calculation, and selectively outputting one of the stored results as the calculated CRC value at the end of the iterative calculation.

13. The method of claim 12, wherein said selective employment of a plurality of CRC calculation assemblies comprise selecting a first CRC calculation assembly to incrementally calculate the CRC value for said first plurality of data word groups for an iteration, whenever the data word extractor extracts a data word group of n/2 or less bytes for the iteration, where n is an even integer.

14. The method of claim 13, wherein said selective employment of the first CRC calculation assembly comprises selectively employing a combination of less than n/2 CRC calculators to incrementally calculate the CRC value for said first plurality of data word groups for an iteration, whenever the data word extractor extracts a data word group of n/2 or less bytes for the iteration.

15. The method of claim 13, wherein said selective employment of the first CRC calculation assembly comprises selectively employing one of n/2 CRC calculators to incrementally calculate the CRC value for said first plurality of data word groups for an iteration, whenever the data word extractor extracts a data word group of n/2 or less data bytes for the iteration.

16. The method of claim 13, wherein said selective employment of the plurality of CRC calculation assemblies further comprise selecting a second CRC calculation assembly to incrementally calculate the CRC value for said first plurality of data word groups for an iteration, whenever the data word extractor extracts a data word group of more than n/2 bytes for the iteration.

17. The method of claim 16, wherein said selective employment of the second CRC calculation assembly comprises selecting a combination of less than n/2 CRC calculators to incrementally calculate the CRC value for said first plurality of data word groups for an iteration, whenever the data word extractor extracts a data word group of more than n/2 bytes for the iteration.

18. The method of claim 16, wherein said selecting of the second CRC calculation assembly comprises selecting one of n/2 CRC calculators to incrementally calculate the CRC value for said first plurality of data word groups for an iteration, whenever the data word extractor extracts a data word group of more than n/2 bytes for the iteration.

19. The method of claim 13, wherein said extraction further comprises extracting a second plurality of data word groups, and said selective employment of the plurality of CRC calculation assemblies further comprise selecting a second CRC calculation assembly to incrementally calculate a CRC value for the second plurality of data word groups, for an iteration, whenever the data word extractor extracts for the second plurality of word groups, a data word group of n/2 or less bytes for the iteration, where n is an even integer.

20. An apparatus comprising:

a plurality of processing units to correspondingly process a plurality of network traffic flows; and a shared CRC generation block coupled to the processing units to alternatively generate a CRC value for a data block of a selected one of the network traffic flows, the shared CRC generation block including at least one CRC generation unit to iteratively generate a first CRC value for the data block of the selected one of the network traffic flows, the at least one CRC generation unit including a plurality of CRC calculation assemblies to be selectively employed to incrementally calculate a CRC value for a first plurality of data word groups, the calculation being iteratively performed, one iteration at a time, and the selection of the CRC calculation assemblies for the various iterations being made in accordance with group sizes of extracted data word groups of the first plurality data words for the various iterations.

21. The apparatus of claim 20, wherein the plurality of CRC calculation assemblies comprise a first CRC calculation assembly coupled to the data word extractor to incrementally calculate the CRC value for said first plurality of data word groups for an iteration, whenever a group size of a data word group of said first plurality of data word groups is n/2 or less bytes for the iteration, where n is an even integer.

22. The apparatus of claim 21, wherein the first CRC calculation assembly comprises less than n/2 CRC calculators coupled to each other in a cascaded manner to be selectively employed in combination in at least some of the times to incrementally calculate the CRC value for said first plurality of data word groups for an iteration, whenever a group size of a data word group of said first plurality of data word groups is n/2 or less bytes for the iteration.

23. The apparatus of claim 21, wherein the first CRC calculation assembly comprises n/2 CRC calculators to be selectively employed exclusively to incrementally calculate the CRC value for said first plurality of data word groups for an iteration, whenever a group size of a data word group of said first plurality of data word groups is n/2 or less data bytes for the iteration.

24. The apparatus of claim 21, wherein the plurality of CRC calculation assemblies further comprise a second CRC calculation assembly coupled to the data word extractor to incrementally calculate the CRC value for said first plurality of data word groups for an iteration, whenever a group size of a data word group of said first plurality of data word groups is more than n/2 bytes for the iteration.

25. The apparatus of claim 24, wherein the second CRC calculation assembly comprises less than n/2 CRC calculators to be selectively employed in combination at least some of the times to incrementally calculate the CRC value for said first plurality of data word groups for an iteration, whenever a group size of a data word group of said first plurality of data word groups is more than n/2 bytes for the iteration.

26. The apparatus of claim 24, wherein the second CRC calculation assembly comprises n/2 CRC calculators to be selectively employed exclusively to incrementally calculate the CRC value for said first plurality of data word groups for an iteration, whenever a group size of a data word group of said first plurality of data word groups is more than n/2 bytes for the iteration.

27. The apparatus of claim 21, wherein the plurality of CRC calculation assemblies further comprise a second CRC calculation assembly to incrementally calculate a CRC value for a second plurality of data word groups, for an iteration, whenever a group size of a data word group of the second plurality of data word groups is n/2 or less bytes for the iteration, where n is an even integer.

*28. An apparatus comprising:*

*a data word extractor to successively extract at least one data word group from a stream of input data, one data word group at a time, the extracted at least one data word group having a group size of at most n bytes, where n is an integer;*

*a plurality of CRC calculation assemblies coupled to the data word extractor to be selectively employed to incrementally calculate a CRC value for the extracted at least one data word group, the calculation being iteratively performed, one iteration at a time, and for each iteration, the selection of the CRC calculation assemblies being made in accordance with the group size of the data word group extracted for the iteration;*

*a plurality of storage elements correspondingly coupled to the plurality of CRC calculation assemblies to correspondingly store the results generated by the corresponding ones of the CRC calculation assemblies for at least one iteration of the calculation; and*

*a plurality of selectors coupled to the storage elements and the plurality of CRC calculation assemblies to selectively re-circulate one of the stored results back to the selected one of the CRC calculation assemblies for a next iteration of calculation, and to selectively output one of the stored results as the calculated CRC value at the end of the iterative calculation.*

*29. The apparatus of claim 28, wherein the plurality of CRC calculation assemblies comprise a first CRC calculation assembly coupled to the data word extractor to incrementally calculate the CRC value for said extracted at least one data word group for an iteration, whenever the data word extractor extracts a data word group of n/2 or less bytes for the iteration, where n is an even integer.*

*30. The apparatus of claim 29, wherein the first CRC calculation assembly comprises less than n/2 CRC calculators coupled to each other in a cascaded manner to be selectively employed in combination in at least some of the time to incrementally calculate the CRC value for said extracted at least one data word group for an iteration, whenever the data word extractor extracts a data word group of n/2 or less bytes for the iteration.*

*31. The apparatus of claim 29, wherein the first CRC calculation assembly comprises n/2 CRC calculators to be selectively employed exclusively to incrementally calculate the CRC value for said extracted at least one data word group for an iteration, whenever the data word extractor extracts a data word group of n/2 or less data bytes for the iteration.*

*32. The apparatus of claim 29, wherein the plurality of CRC calculation assemblies further comprise a second CRC calculation assembly coupled to the data word extractor to incrementally calculate the CRC value for said extracted at least one data word group for an iteration, whenever the data word extractor extracts a data word group of more than n/2 bytes for the iteration.*

*33. The apparatus of claim 32, wherein the second CRC calculation assembly comprises less than n/2 CRC calculators to be selectively employed in combination at least some of the times to incrementally calculate the CRC value for said at least one data word group for an iteration, whenever the data word extractor extracts a data word group of more than n/2 bytes for the iteration.*

*34. The apparatus of claim 32, wherein the second CRC calculation assembly comprises n/2 CRC calculators to be selectively employed exclusively to incrementally calculate the CRC value for said extracted at least one data word group for an iteration, whenever the data word extractor extracts a data word group of more than n/2 bytes for the iteration.*

*35. The apparatus of claim 29, wherein the data word extractor also extracts a second at least one data word group, and the plurality of CRC calculation assemblies further comprise a second CRC calculation assembly coupled to the data word extractor to incrementally calculate a CRC value for the second extracted at least one data word group, for an iteration, whenever the data word extractor extracts for the second extracted at least one data word group, a data word group of n/2 or less bytes, where n is an even integer.*

*36. The apparatus of claim 28, wherein the plurality of selectors comprise a first selector coupled to the storage elements and the plurality of CRC calculation assemblies to*

*selectively re-circulate one of the stored results back to the selected one of the CRC calculation assemblies for the next iteration of calculation, and a second selector coupled to the first selector to cooperate with the first selector to selectively output one of the stored results as the calculated CRC value at the end of the iterative calculation.*

*37. The apparatus of claim 28, wherein n equals 8.*

*38. The apparatus of claim 28, wherein the apparatus is disposed on an integrated circuit.*

*39. A method comprising:*

*successively extracting by a data word extractor at least one data word group from a stream of input data, one data word group at a time, the extracted at least one data word group having a group size of at most n bytes, where n is an integer;*

*selectively employing a plurality of CRC calculation assemblies coupled to the data word extractor to incrementally calculate a CRC value for the extracted at least one data word group, with the calculation being iteratively performed, one iteration at a time, and for each iteration, selecting the CRC calculation assemblies in accordance with the group size of the data word group extracted for the iteration;*

*correspondingly storing the results generated by the plurality of CRC calculation assemblies for one iteration of the iterative calculation into a plurality of storage elements; and*

*selectively re-circulating one of the stored results back to the selected one of the CRC calculation assemblies for the next iteration of calculation, and selectively outputting one of the stored results as the calculated CRC value at the end of the iterative calculation.*

*40. The method of claim 39, wherein said selective employment of a plurality of CRC calculation assemblies comprise selecting a first CRC calculation assembly to incrementally calculate the CRC value for said extracted at least one data word group for an iteration, whenever the data word extractor extracts a data word group of n/2 or less bytes for the iteration, where n is an even integer.*

*41. The method of claim 40, wherein said selective employment of the first CRC calculation assembly comprises selectively employing a combination of less than n/2 CRC calculators to incrementally calculate the CRC value for said extracted at least one data word group for an iteration, whenever the data word extractor extracts a data word group of n/2 or less bytes for the iteration.*

*42. The method of claim 40, wherein said selective employment of the first CRC calculation assembly comprises selectively employing one of n/2 CRC calculators to incrementally calculate the CRC value for said extracted at least one data word group for an iteration, whenever the data word extractor extracts a data word group of n/2 or less data bytes for the iteration.*

*43. The method of claim 40, wherein said selective employment of the plurality of CRC calculation assemblies further comprise selecting a second CRC calculation assembly to incrementally calculate the CRC value for said extracted at least one data word group for an iteration, whenever the data word extractor extracts a data word group of more than n/2 bytes for the iteration.*

*44. The method of claim 43, wherein said selective employment of the second CRC calculation assembly comprises selecting a combination of less than n/2 CRC calculators to incrementally calculate the CRC value for said extracted at least one data word group for an iteration, whenever the data word extractor extracts a data word group of more than n/2 bytes for the iteration.*

*45. The method of claim 43, wherein said selecting of the second CRC calculation assembly comprises selecting one of n/2 CRC calculators to incrementally calculate the CRC value for said extracted at least one data word group for an iteration, whenever the data word extractor extracts a data word group of more than n/2 bytes for the iteration.*

*46. The method of claim 40, wherein said extraction further comprises extracting a second at least one word group, and said selective employment of the plurality of CRC calculation assemblies further comprise selecting a second CRC calculation assembly to incrementally calculate a CRC value for the second extracted at least one data word group for an iteration, whenever the data word extractor extracts for the second extracted at least one data word group, a data word group of n/2 or less bytes for the iteration, where n is an even integer.*

* * * * *